(12) United States Patent
Chang et al.

(10) Patent No.: US 7,456,436 B2
(45) Date of Patent: Nov. 25, 2008

(54) LED DEVICE HAVING REDUCED SPECTRUM

(75) Inventors: Jenq-Yang Chang, Jhongli (TW);
Jinn-Kong Sheu, Tainan (TW);
Chien-Chieh Lee, Jhongli (TW);
Yeeu-Chang Lee, Jhongli (TW);
Che-Lung Hsu, Jhongli (TW);
Yun-Chih Lee, Jhongli (TW);
Shen-Hang Tu, Jhongli (TW)

(73) Assignee: National Central University, Taoyuan County (TW)

( * ) Notice: Subject to any disclaimer, the term of this patent is extended or adjusted under 35 U.S.C. 154(b) by 0 days.

(21) Appl. No.: 11/583,124

(22) Filed: Oct. 19, 2006

(65) Prior Publication Data
US 2007/0295979 A1    Dec. 27, 2007

(30) Foreign Application Priority Data
Jun. 22, 2006   (TW) .............................. 95122443 A

(51) Int. Cl.
*H01L 27/15* (2006.01)

(52) U.S. Cl. .............................. 257/98; 257/13; 257/79; 257/E25.032; 257/E51.022; 362/800

(58) Field of Classification Search .................. None
See application file for complete search history.

(56) References Cited

U.S. PATENT DOCUMENTS

| | | | |
|---|---|---|---|
| 2006/0278888 A1* | 12/2006 | Kim et al. | 257/103 |
| 2006/0289886 A1* | 12/2006 | Sakai | 257/98 |
| 2008/0135864 A1* | 6/2008 | David et al. | 257/98 |

* cited by examiner

*Primary Examiner*—Evan Pert
*Assistant Examiner*—Scott R Wilson
(74) *Attorney, Agent, or Firm*—Troxell Law Office, PLLC

(57) ABSTRACT

A structure of light emitting diode (LED) effectively reduces its spectral width. The LED structure is applied in a three color mixing of a backlight module to broaden a color space and to improve a saturation of a color display. A grating structure is used as a waveguide layer to coordinate with the LED structure. The present invention does not affect the original thermo and electrical characteristics of the LED structure and has a simple fabrication method.

2 Claims, 3 Drawing Sheets

LED DEVICE HAVING REDUCED SPECTRUM

FIELD OF THE INVENTION

The present invention relates to a light emitting diode (LED) device; more particularly, relates to reducing a spectral width of the LED device.

DESCRIPTION OF THE RELATED ARTS

A color filter is essential to a backlight device for a back light source of a general LED. But a color filter do not produce a single spectral width. That is, the LED spectral width obtained through the color filter is still too wide for a big color gamut required for a back light source. In addition, the color filter is fabricated through a multi-layer deposition, so that its cost and required precision are both high.

A LED having resonance cavity is another solution. Light is resonated in the resonance cavity to reduce its spectral width. Yet the epitaxy structure required in this kind of LED is complex and the product obtained has negative effects to its thermo and electrical characteristics.

Although the above prior arts reduce their spectral width, the backlight source of LED has a narrow color mixing gamut owing to its wide green wavelength and the LED spectral width obtained through the color filter is too wide as well; and the epitaxy structure produces some other problems. Hence, the prior arts do not fulfill users' requests on actual use.

SUMMARY OF THE INVENTION

The main purpose of the present invention is to reduce a spectral width of a LED device through a simple fabrication method so that a color space is broadened and a saturation of a color display is improved in a three color mixing of a backlight module To achieve the above purpose, the present invention is a LED device having a reduced spectrum, comprising a substrate, a LED structure on the substrate and a grating structure on the LED structure, where the substrate is made of sapphire; the LED structure comprises an N-type gallium nitride (GaN) layer, an active layer and a P-type GaN layer; and the grating structure is made of a dielectric medium material or P-type GaN.

Or, in another embodiment, the present invention comprises a substrate, an N-type GaN layer on the substrate, an active layer on the N-type GaN layer and a P-type GaN layer having a grating structure on the active layer, where the substrate is made of sapphire.

Accordingly, a novel LED device having a reduced spectrum is obtained.

BRIEF DESCRIPTION OF THE DRAWINGS

The present invention will be better understood from the following detailed descriptions of the preferred embodiments according to the present invention, taken in conjunction with the accompanying drawings, in which.

DESCRIPTION OF THE PREFERRED EMBODIMENTS

The following descriptions of the preferred embodiments are provided to understand the features and the structures of the present invention.

Figure 1:
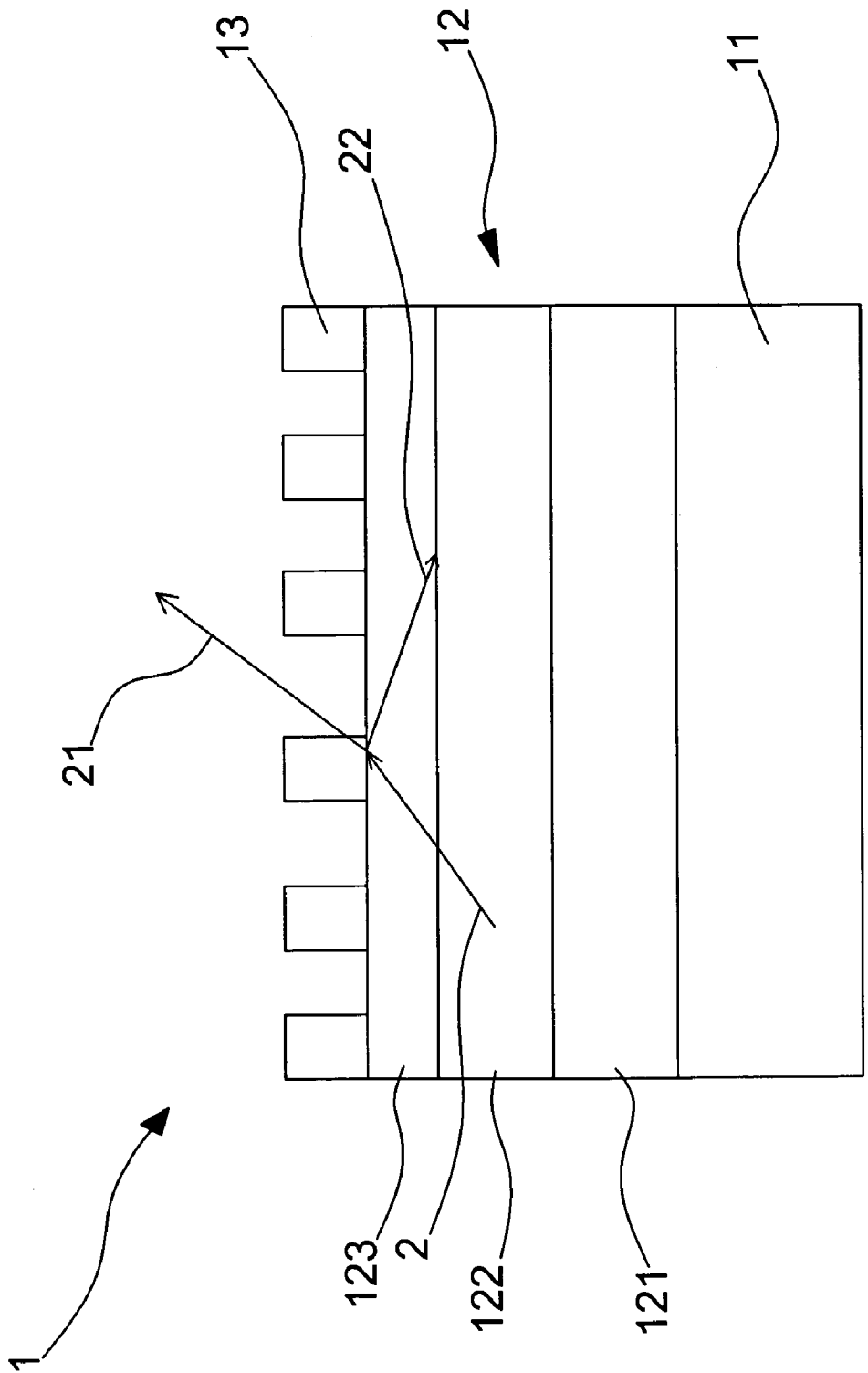
FIG. 1 is the view showing the state of use of the first preferred embodiment according to the present invention.

Please refer to FIG. 1, which is a view showing a state of use of a first preferred embodiment according to the present invention. As shown in the figure, the present invention is a light emitting diode (LED) device having a reduced spectrum, comprising a substrate 11, a LED structure 12 on the substrate 11 and a grating structure 13 on the LED structure 12, where the substrate 11 is made of sapphire; the LED structure 12 comprises an N-type gallium nitride (GaN) layer 121, an active layer 122 and a P-type GaN layer 123; and the grating structure is made of a dielectric medium material.

The LED structure 12 of the LED device 1 emits a multiple wave-length light source 2. When the light source 2 encounters the grating structure 13, the light source 2 is divided into a first light source 21 and a second light source 22. The first light source 21 is the part of light source passing by the grating structure 13 by a selection through the grating structure 13. The second light source 22 is the part of light source reflected back by the grating structure 13. Hence, the LED device 1 filters a spectrum and reduces a spectral width of a LED.

Figure 2:
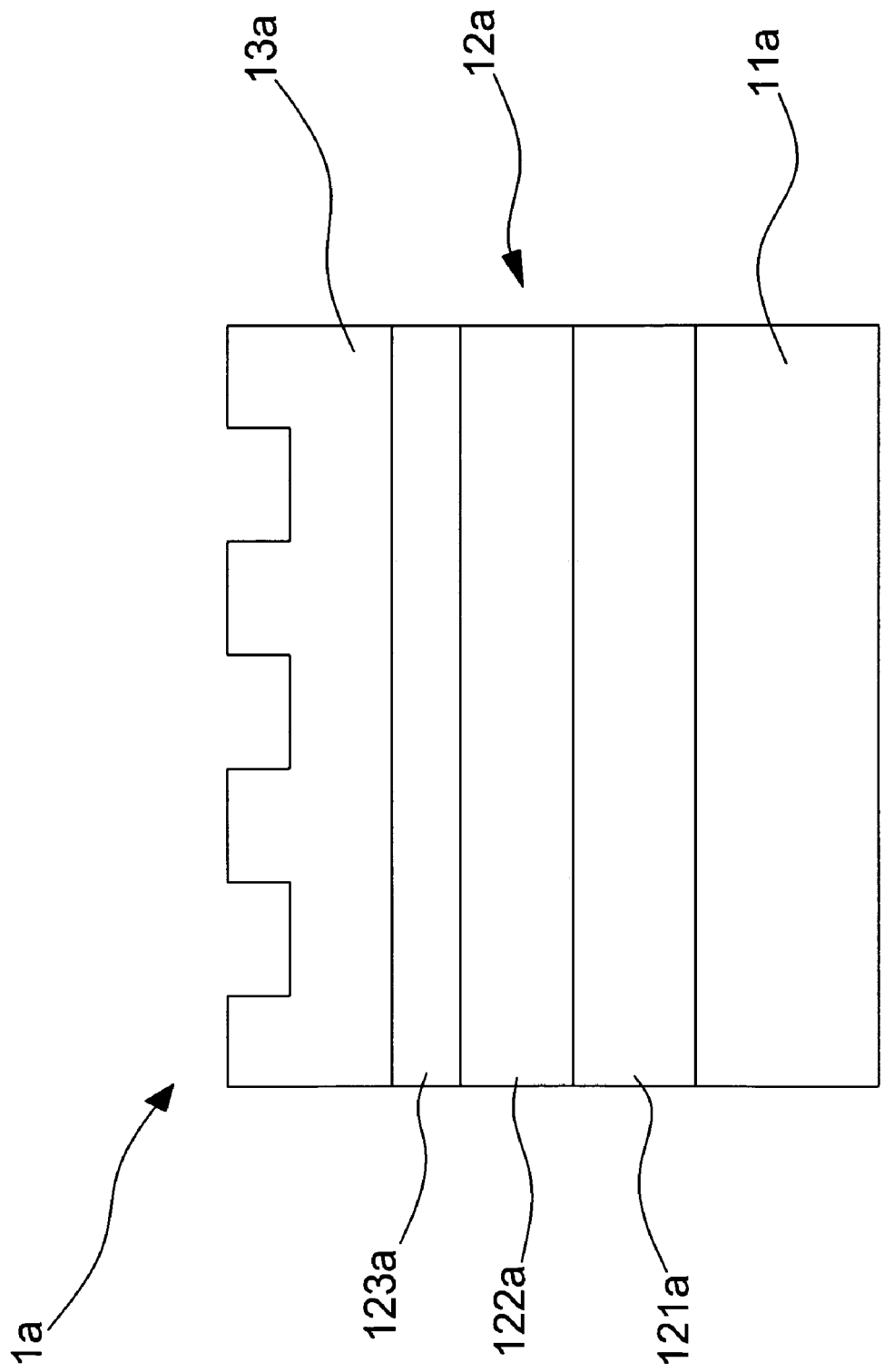
FIG. 2 is the structural view showing the second preferred embodiment.

Please refer to FIG. 2, which is a structural view showing a second preferred embodiment. As shown in the figure, a LED device 1a according to the present invention comprises a substrate 11a, a LED structure 12a on the substrate 11a and a grating structure 13a on the LED structure 12a, where the substrate 11a is made of sapphire; the LED structure 12a comprises an N-type GaN layer 121a, an active layer 122a and a P-type GaN layer 123a; and the grating structure 13a is made of P-type GaN.

Figure 3:
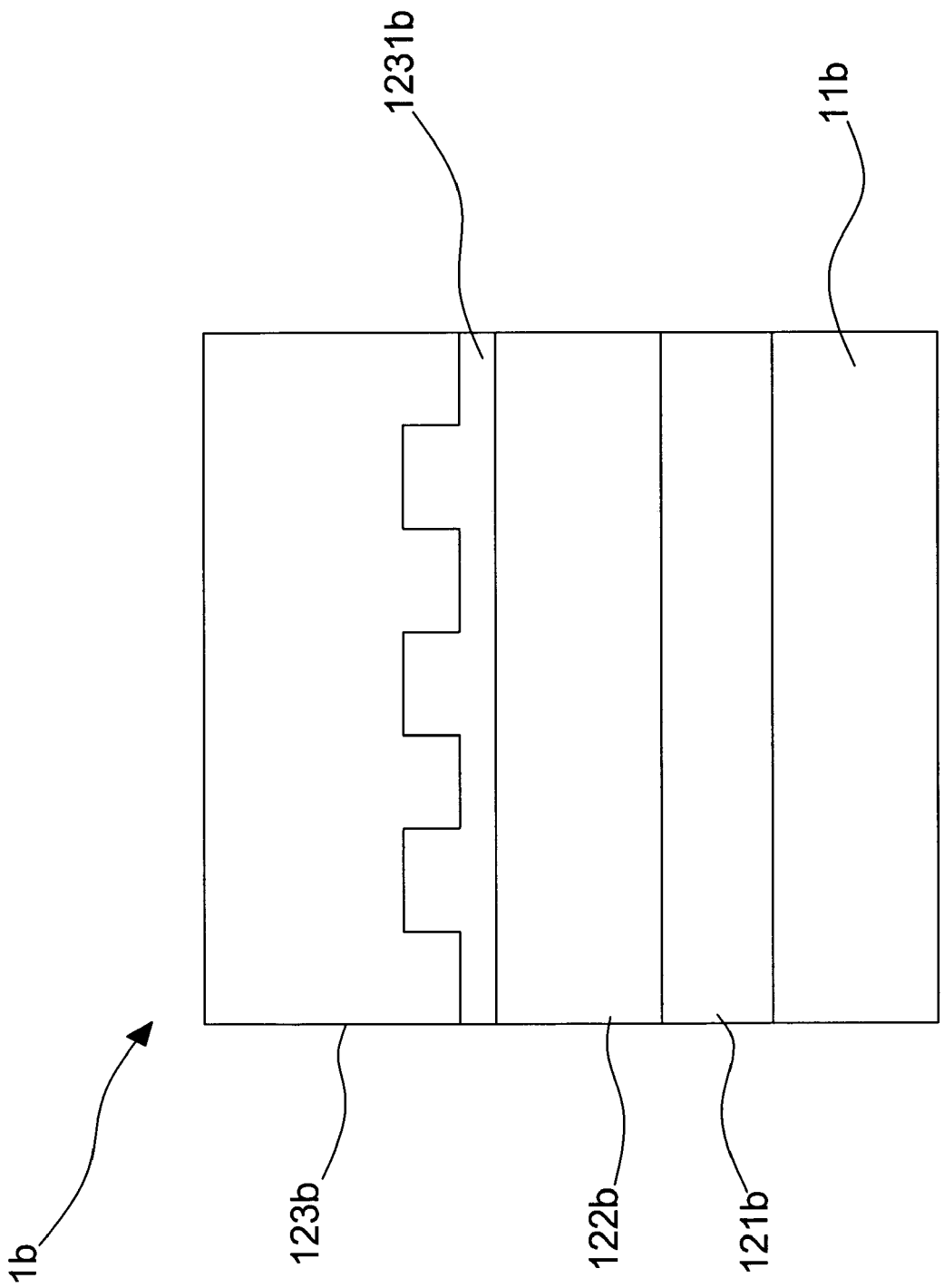
FIG. 3 is the structural view showing the third preferred embodiment.

Please refer to FIG. 3, which is a structural view showing a third preferred embodiment. As shown in the figure, a LED device 1b according to the present invention comprises a substrate 11b, an N-type GaN layer 121b on the substrate 11b, an active layer 122b on the N-type GaN layer 121b and a P-type GaN layer 123b having a grating structure 1231b on the active layer 122b, where the substrate 11b is made of sapphire.

To sum up, the present invention is a LED device having a reduced spectrum, where a spectral width of a LED structure is reduced and a production of the LED device is simplified.

The preferred embodiments herein disclosed are not intended to unnecessarily limit the scope of the invention. Therefore, simple modifications or variations belonging to the equivalent of the scope of the claims and the instructions disclosed herein for a patent are all within the scope of the present invention.

What is claimed is:

1. A LED device having a reduced spectrum, comprising:
   a substrate;
   an N-type GaN layer, said N-type GaN layer being deposed on said substrate;
   an active layer, said active layer being deposed on said N-type GaN layer;
   a grating structure deposed on an upper surface of the active layer; and
   a P-type GaN layer, said P-type GaN layer being deposed on an upper surface of said grating structure.

2. The device according to claim 1, wherein said substrate is made of sapphire.

* * * * *